United States Patent
Saito (10) Patent No.: US 6,297,659 B1
(45) Date of Patent: Oct. 2, 2001

(54) TEST SYSTEM FOR TESTING SEMICONDUCTOR DEVICE

(75) Inventor: Yumi Saito, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/433,208

(22) Filed: Nov. 4, 1999

(30) Foreign Application Priority Data

Nov. 5, 1998 (JP) .................................. 10-315175

(51) Int. Cl.$^7$ .......................... G01R 31/26; G01R 31/02
(52) U.S. Cl. .................................. 324/765; 324/760
(58) Field of Search .......................... 324/765, 760, 324/537

(56) References Cited

U.S. PATENT DOCUMENTS

| | | | |
|---|---|---|---|
| 4,467,275 | * 8/1984 | Maeda et al. | 324/765 |
| 5,489,851 | * 2/1996 | Heumann et al. | 324/760 |
| 5,680,056 | * 10/1997 | Ito et al. | 324/750 |

FOREIGN PATENT DOCUMENTS

| | | |
|---|---|---|
| 1-105932 | 9/1989 | (JP) . |
| 5-13658 | 3/1993 | (JP) . |

* cited by examiner

Primary Examiner—Safet Metjahic
Assistant Examiner—Jermele Hollington
(74) Attorney, Agent, or Firm—Sughrue, Mion, Zinn, Macpeak & Seas, PLLC (57) ABSTRACT

In a test system, a plurality of semiconductor devices (samples) to be tested are connected in parallel. Resistors and switches are connected to the respective semiconductor devices in series. A voltage source (power supply) supplies a constant voltage for the respective semiconductor devices. An ammeter measures current that flows through the respective semiconductor devices. A voltmeter measures the respective voltage drops of the resistors. A controller detects the specific resistor that is changed in a resistance value when the current measured by the ammeter is reduced, and turns off the switch connected to the specific resistor.

8 Claims, 7 Drawing Sheets

TEST SYSTEM FOR TESTING SEMICONDUCTOR DEVICE

BACKGROUND OF THE INVENTION

This invention relates to a test system for testing a semiconductor device, and in particular, to a test system suitable for testing a plurality of samples with one power supply at the same time.

Figure 1:
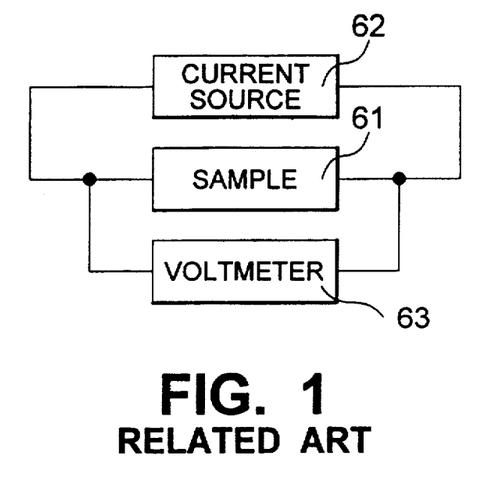
FIG. 1 is a circuit diagram showing a first related test system for testing a semiconductor device.

Referring to FIG. 1, description will be made about a first related system for testing a semiconductor device (sample).

As illustrated in FIG. 1, a system for testing reliability of electromigration (EM) generally includes a sample 61 to be tested, a current source 62, and a voltmeter 63.

With such a structure, the current source 62 is provided for the sample 61. Current flows from the current source 62, and a voltage applied for the sample 61 is measured by the use of the voltmeter 63 on request.

In this example, although the number of the sample is set to one, a plurality of samples are generally arranged, and the current sources corresponding to the number are provided in the system. In this event, only one voltmeter is provided, and the respective voltages of the samples are sequentially measured by switching terminals.

Figure 2:
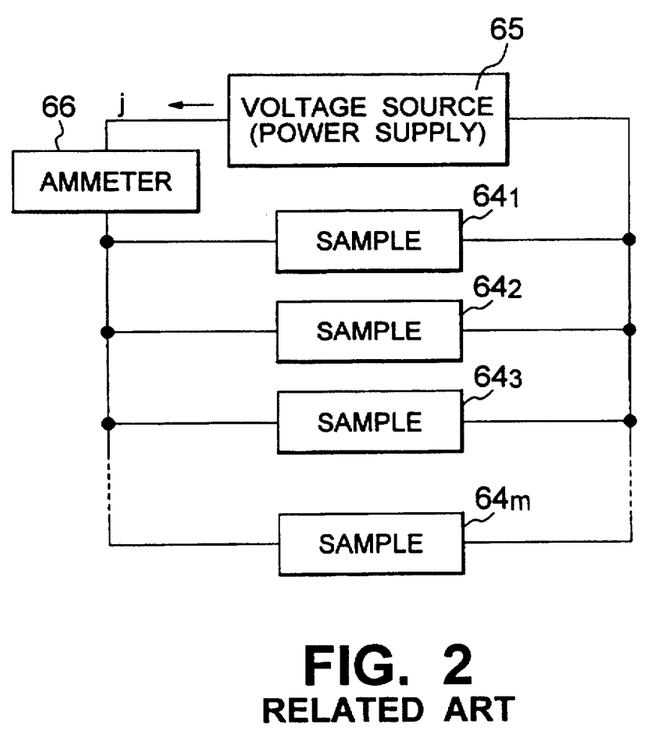
FIG. 2 is a circuit diagram showing a second related test system for testing a semiconductor device.

Referring to FIG. 2, description will be made about a second related system for testing a semiconductor device (sample).

The system illustrated in FIG. 2 is generally used when the number of samples to be tested is increased.

In the system, samples $64_1 \sim 64_m$ (m≧2) are connected for one voltage source (power supply) 65 in parallel. With this structure, a constant voltage is applied to both ends of each sample $64_1 \sim 64_m$, and thereby, a current, which flows through the total of the samples, is measured by the use of an ammeter (galvanometer) 66 on request.

Under this circumstance, when either one of the samples $64_1 \sim 64_m$ is cut off, a current j, which flows through the ammeter 66, is reduced.

Figure 3:
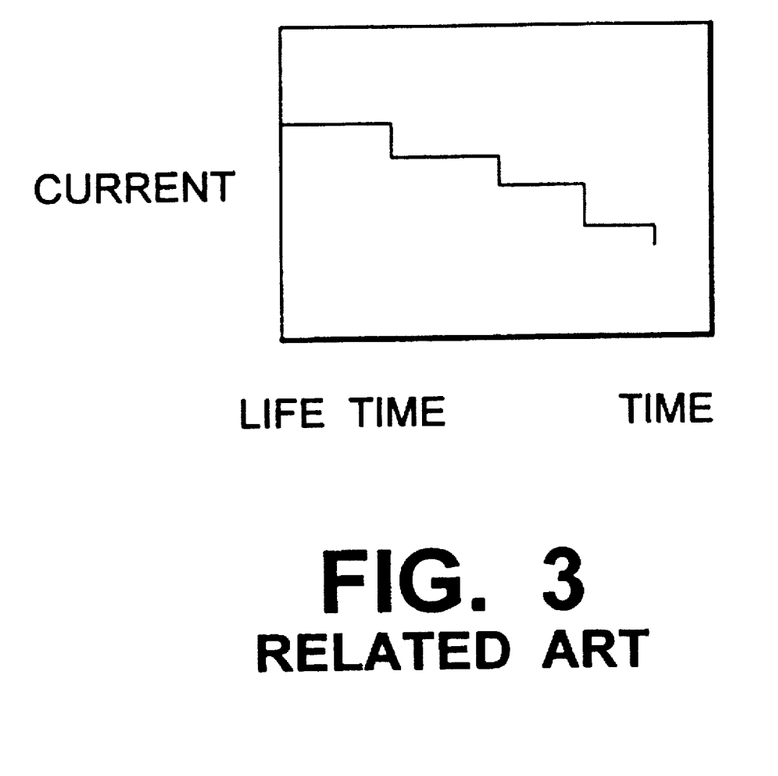
FIG. 3 is a graph showing a relation between elapsed time and current in a second related test system.

When the above-mentioned current-carrying test is continued, a relation between elapsed time and current is variable in the step-wise manner as represented in a graph illustrated in FIG. 3.

In this graph, the elapsed time until the current is changed in the step-wise manner from the current-carrying start time is defined as electromigration (EM) lifetime of the cut-off sample.

In the system illustrated in FIG. 1, the current sources corresponding to the sample number are required in the system when the constant current source is provided for each sample to be tested. In consequence, the sample number can not be set to a high value in this system.

On the other hand, in case that a plurality of samples are connected in parallel in the system illustrated in FIG. 2, the current is reduced in the step-wise manner when the sample is cut off. Thereby, the time until disconnection is judged as the lifetime of each sample.

However, resistance variation, which is not in a disconnection state, generally occurs in a lamination wiring pattern (for example, TiN/AlCu/TiN/Ti) which is used in the recent LSI (Large Scale Integrated Circuit). Consequently, the sample is also judged as a defective product by the resistance variation.

When the sample is variable in a resistance value, the current continues to flow through the sample, and a current value is changed in dependency upon the resistance value of the sample.

As a result, the current, which flows through the ammeter 66, is varied with time, and the constant current test can not practically carried out in this system.

In this case, it is difficult to judge the lifetime of each sample because the current value of the ammeter 66 is not changed in the step-wise manner.

From the above-mentioned reason, the system, in which the respective samples are connected in parallel, can not be used for the sample which has variable resistance value.

In general, when the EM reliability of the LSI wiring pattern is evaluated in the test, as the number of the sample is larger, lifetime estimation test can be more accurately performed in the LSI which is fabricated on the basis of the same specification.

In particular, initial faulty is often deviated from the log-normal plot. Therefore, unless the number of the sample is increased, the initial faulty can not be detected.

SUMMARY OF THE INVENTION

It is therefore an object of this invention to provide a test system for testing a semiconductor device which is capable of increasing the number of samples and measuring lifetime of each sample with low cost.

In a test system according to this invention, a plurality of semiconductor devices (samples) to be tested are connected in parallel. Resistors are connected to the respective semiconductor devices in series. Switches are connected to the respective resistors in series.

With this structure, a voltage source (power supply) supplies a constant voltage for the respective semiconductor devices. An ammeter measures current that flows through the respective semiconductor devices from the voltage source. A voltmeter measures the respective voltage drops of the resistors.

A controller is connected to the switches, the voltage source and the ammeter. The controller detects the specific resistor that is changed in a resistance value when the current measured by the ammeter is reduced, and turns off the switch connected to the specific resistor.

In this case, the controller stores first voltage drops of the respective resistors at test starting time, and stores second voltage drops of the respective resistors when the current is reduced. Under this circumstance, the controller detects the specific resistor by comparing the first voltage drops with the second voltage drops.

Further, the controller continues to test the remaining semiconductor devices except the semiconductor device connected to the specific resistor after the detection of the specific resistor.

Herein, elapsed time until the detection of the specific resistor from the test starting time is defined as lifetime of the semiconductor device connected to the specific resistor.

In this event, the current value for the elapsed time is changed in a step-wise manner.

The resistor comprises a variable resistor. The variable resistor serves to correct manufacturing variation of internal resistance with respect to each semiconductor device.

Alternatively, the semiconductor devices and the resistor may be integrated in an integrated circuit. In this event, the integrated circuit has a first electrode pad, a second electrode pad, a third electrode pad, and a fourth electrode pad. The semiconductor device and the resistor are connected between the first electrode pad and the second electrode pad. The first electrode pad is coupled to the ammeter while the second electrode pad is coupled to the switch. The third electrode pad and the fourth electrode pad are coupled to the voltmeter.

More specifically, a plurality of samples are connected in parallel, and the resistor and the switch are directly connected to the respective samples. With this structure, when the current that which flows through the total samples is changed, a voltage drop at both ends of each resistor is monitored by the use of the voltmeter.

When the variation of the voltage drop at the both ends is detected, the elapsed time until the detection of the variation is measured.

Thereafter, the flow of the current through the sample is prevented by turning off the switch. Thereby, the test can be continuously carried out without affect for the other samples.

In the test system, the current flows through a plurality of test samples with one power supply.

Further, the resistor is connected to each sample in series, and the same current simultaneously flows through each sample. Thereby, the changes of the resistance values of the respective samples can be collectively monitored by the changes of the voltage drops at the both ends of the resistors.

Moreover, the switches are connected to the respective resistors in series. Thereby, the sample, which is changed in the resistance value, is cut off from the voltage source (power supply) via the switch, and as a result, the cut-off sample is not tested.

When the switch is turned off, the total current quantity measured by the ammeter (galvanometer) is reduced. The elapsed time until the reduction of the current value is defined as the lifetime of the sample which is changed in the resistance value.

By repeating this operation, the current value for the elapsed time changes in the step-wise manner. Consequently, the lifetime of each sample can be determined.

In addition, the variable resistor is used as the resistor connected to each sample in series. In consequence, the affect of the manufacturing variation of internal resistance of each sample can be equivalently corrected until the test starting time.

DESCRIPTION OF PREFERRED EMBODIMENT

Figure 4:
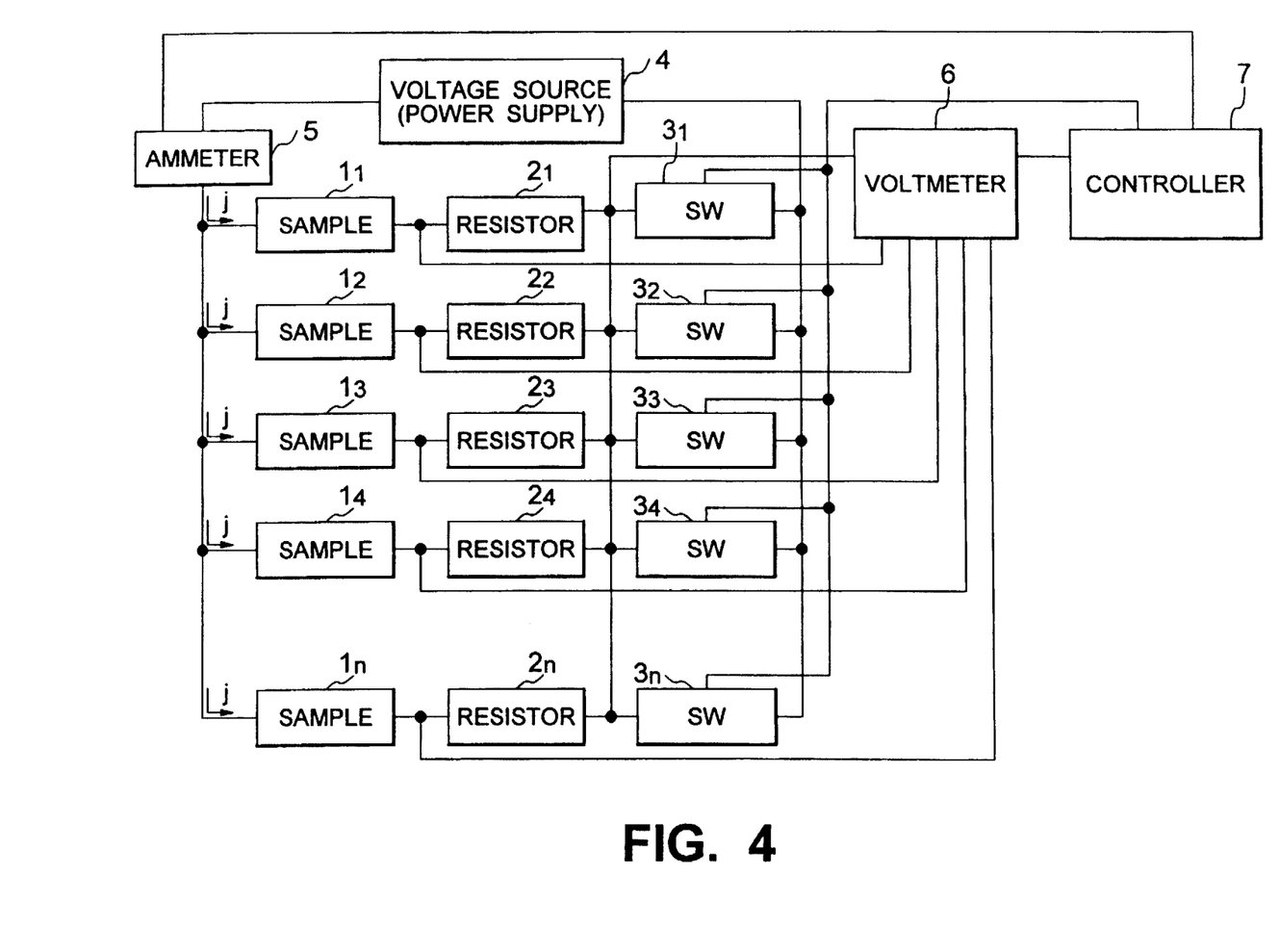
FIG. 4 is a circuit diagram showing a test system for testing a semiconductor device according to an embodiment of this invention.

Referring to FIG. 4, description will be made about a test system for testing a semiconductor device according to an embodiment of this invention.

In a system illustrated in FIG. 4, samples $1_1 \sim 1_n$ are semiconductor device to be tested. The samples $1_1 \sim 1_n$ are connected to a voltage source (power supply) 4, respectively.

Further, the voltage source 4 and an ammeter (galvanometer) 5 are serially connected to each sample $1_1 \sim 1_n$ which is connected in parallel.

Resistors $2_1 \sim 2_n$ and switches $3_1 \sim 3_n$ are connected to the sample $1_1 \sim 1_n$ in series, respectively. Both ends of the resistors $2_1 \sim 2_n$ are independently coupled to a voltmeter 6, respectively.

Voltage drops at the both ends of the resistors $2_1 \sim 2_n$ are independently measured by the use of the voltmeter 6. A controller 7 monitors the ammeter 5 and the voltmeter 6, and controls the switches $3_1 \sim 3_n$ by the use of an instruction signal after test starting time.

Subsequently, description will be made about an operation of the test system.

First, the switches $3_1 \sim 3_n$ are simultaneously turned on by the use of the instruction signal from the controller 7 at the test starting time. Thereby, the current having the same current value (j) flows through the respective sample $1_1 \sim 1_n$ from the voltage source (power supply) 4.

At the same time, the voltages at both ends of the resistors $2_1 \sim 2_n$ at the test starting time are determined by the voltages indicated by the voltmeter 6, and stored in the controller 7 in advance. The current measured by the ammeter 5 is monitored and stored by the controller 7 on request.

When the resistance value of either one of samples $1_1 \sim 1_n$ is increased by electromigration (EM), the current, which flows through the ammeter 5, is reduced. The controller 7 recognizes the current reduction, and measures the voltages at the both ends of the resistors $2_1 \sim 2_n$ by the use of the voltmeter 6 to feed back to the controller 7.

Under such circumstance, when it is recognized that the voltage at the both ends of the resistor 2x ($1 \leq x \leq n$) is fluctuated, it is judged that the sample 1x connected to the resistor 2x is varied in the resistance value by the electromigration (EM).

Thus, when the controller 7 detects the sample 1x connected to the varied resistor 2x, the switch 3x connected to the resistor 2x in series is turned off by the use of the instruction signal from the controller 7.

Thereafter, the test for the other samples except the sample 1x is continued on the condition that no current flows through the sample 1x.

The elapsed time until the voltage variation of the resistor 2x from the test starting time is determined as the lifetime of the sample 1x.

Figure 5:
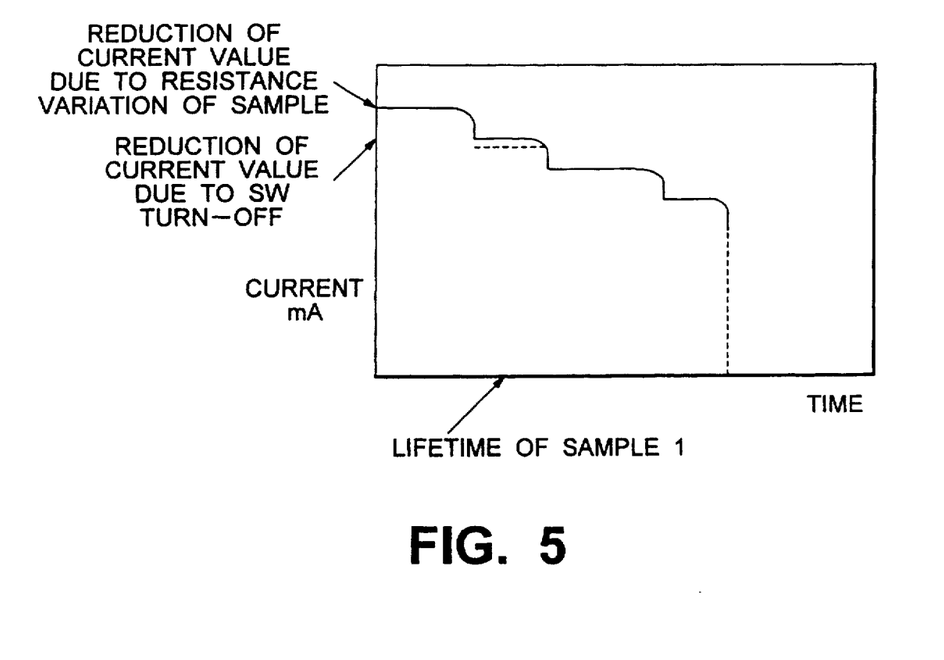
FIG. 5 is a graph showing a relation between elapsed time and current in a test system for testing a semiconductor device according to an embodiment of this invention.

As a result of the above-mentioned test operation, the current value measured by the ammeter 5 is changed in the step-wise manner for the elapsed time in the graph illustrated in FIG. 5.

In the above-mentioned embodiment, resistances of the samples $1_1 \sim 1_n$ are equal to each other, and each resistor $2_1 \sim 2_n$ connected to each samples $1_1 \sim 1_n$ has the same specification.

However, each of sample $1_1 \sim 1_n$ is actually varied in inherent resistance value due to variation of the manufacturing dimension. Therefore, the values of the current, which flows through the respective sample $1_1$~$1_n$, are different from to each other.

In this case, when a resistance value of each sample $1_1$~$1_1$n is originally large, the value of the current, which flows through each sample, becomes small. Consequently, variation of the current density of the current also becomes small.

However, it is practical to test the lifetime including the manufacturing variation in the electromigration (EM) test. In consequence, it is often required that the current values of the respective samples $1_1$~$1_n$ are equal to each other.

To satisfy this requirement, variable resistors are used as the resistors $2_1$~$2_n$. Under this condition, the resistance values of the variable resistors are adjusted before the test starting time.

In this case, a resistance value of a test partial circuit having the variable resistor and the sample $1_1$~$1_n$ is measured by the use of a resistance measuring apparatus (not shown) which is given with fine voltage. As a result, the respective resistance values can be adjusted to the same value.

The value of the current, which flows through the variable resistor at the subsequent test time, namely, the current, which flows through each sample $1_1$~$1_n$, can be set to the same value by the above-mentioned previous adjustment.

In this event, it is can be prevented that the previous adjustment gives affect for the lifetime of each sample $1_1$~$1_n$ because the resistance measuring apparatus applies only the fine voltage for each sample $1_1$~$1_n$ during the measurement.

The resistance measuring apparatus necessary to the previous adjustment is arranged at the same area as the voltage source 4. Thereby, the resistance measuring apparatus can be used by switching with the voltage source 4.

In this event, selecting means for selecting an arbitrary one among the test partial circuits, each of which has the variable resistor and the sample $1_1$~$1_n$, can be readily realized by the use of the switches $3_1$~$3_n$ and the controller 7.

The resistors $2_1$~$2_n$ and the samples $1_1$~$1_n$ are connected as the different devices in series. However, an arbitrary serial connection circuit including a resistor 52 and a sample (test pattern) 51 can be integrated in one chip 50 (integrated circuit), as illustrated in FIG. 8.

In consequence, a circuit structure of a test apparatus can be simplified because it is not required to provide the resistors $2_1$~$2_n$ as circuit elements of the test apparatus, as illustrated in FIG. 4.

Figure 8:
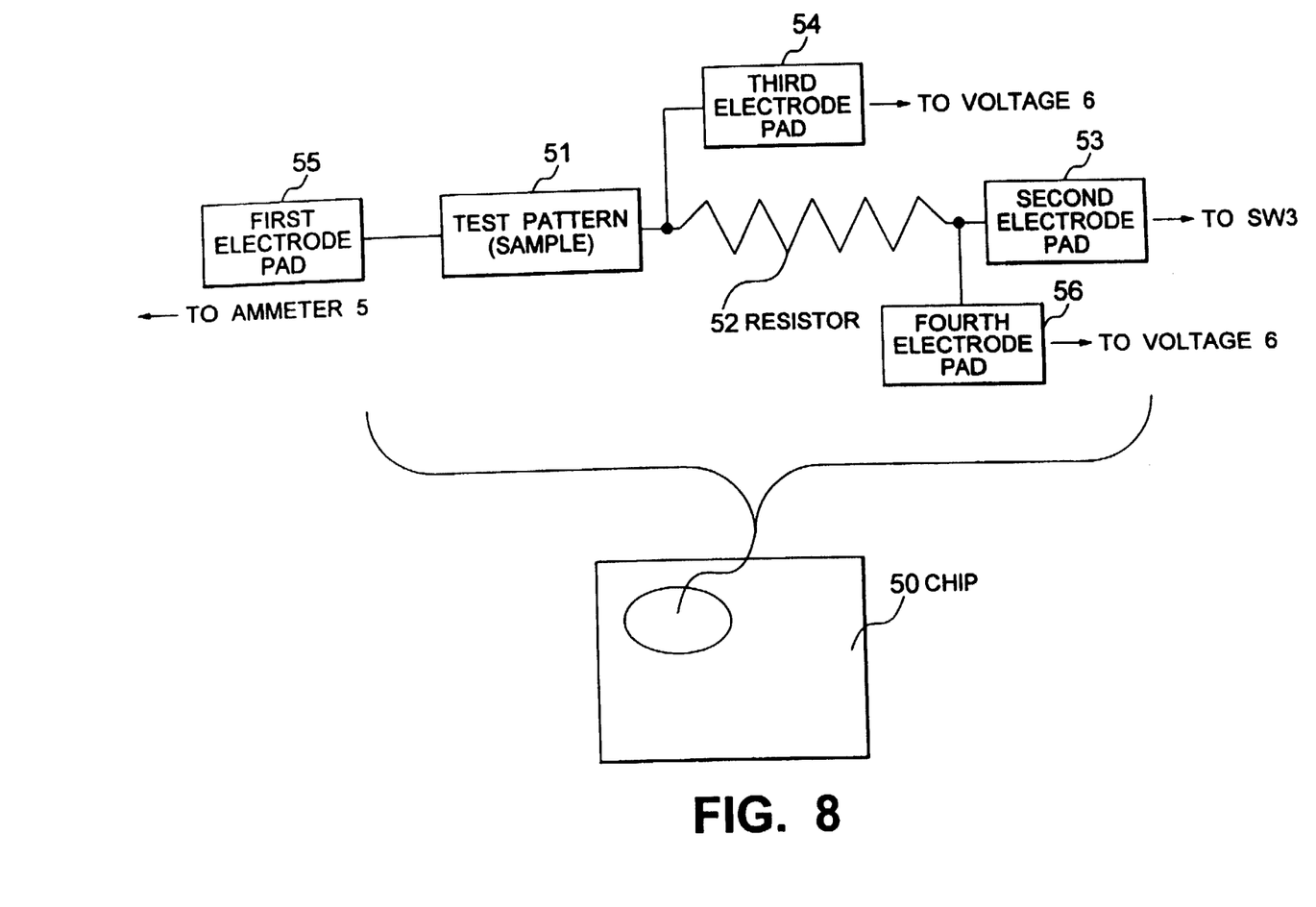
FIG. 8 is a circuit diagram in which a portion of a circuit structure of a test system according to an embodiment of this invention is integrated in an integrated circuit.

In FIG. 8, the integrated circuit has a first electrode pad 55, a second electrode pad 53, a third electrode pad 54, and a fourth electrode pad 56. The sample 51 and the resistor 52 are connected between the first electrode pad 55 and the second electrode pad 53. The first electrode pad 55 is coupled to the ammeter 5 while the second electrode pad 53 is coupled to the switch 3. The third electrode pad 54 and the fourth electrode pad 56 are coupled to the voltmeter 6, respectively.

Specifically, a voltage is applied between the first electrode pad 55 and the second electrode pad 53 via the switch 3 in the circuit illustrated in FIG. 8. Thereby, the current flows through the sample (test pattern) 51 of the integrated circuit.

With such a structure, the voltage at the both ends of the resistor 52 of the integrated circuit is measured via the third electrode pad 54 and the fourth electrode pad 56.

(EXAMPLE)

Figure 6:
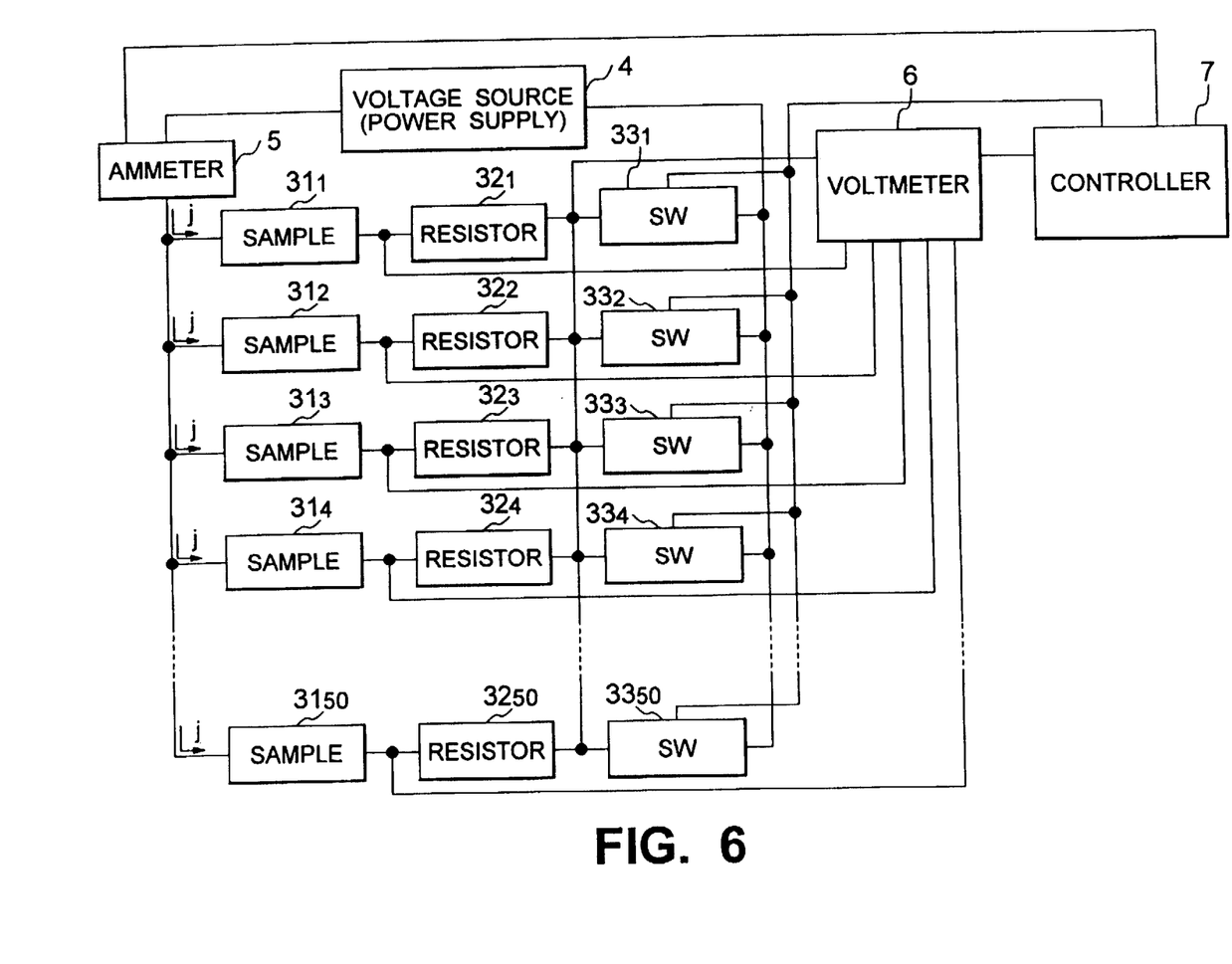
FIG. 6 is a circuit diagram showing a test system for testing a semiconductor device according to an example of this invention.

Referring to FIG. 6, description will be made about a circuit structure of a test system of testing a semiconductor device according to an example of this invention.

A resistance value of each sample $31_1$~$31_{50}$ was equal to about 20Ω.

Fifty samples $31_1$~$31_{50}$ were connected in parallel, and the resistance value of each resistor $32_1$~$32_{50}$ connected to each sample $31_1$~$31_{50}$ in series was equal to 100Ω.

Each sample $31_1$~$31_{50}$ had wiring line width of 0.4 μm and wiring line thickness of 0.45 μm so as to set current density to 2E6A/cm$^2$.

Further, current of 160 mA flowed in total in order to flow the current of 3.2 mA for each sample $31_1$~$31_{50}$. To this end, the applied voltage due to the voltage source (power supply) 4 was set to 0.96V.

During the test, the current was constantly measured by the ammeter 5. Current value was monitored by the controller 7. After 125 hr (time) from the current application, the current value was reduced to 159.8 mA.

When the change of the current was detected by the controller 5, the voltages of the resistors $32_1$~$32_{50}$ connected to the samples $31_1$~$31_{50}$ in series was measured by the voltmeter 6.

The voltmeter 6 had multi-channel in accordance with the fifty samples $31_1$~$31_{50}$. In this event, the voltage of the resistor $32_1$ connected to the sample $31_1$ was reduced from 0.32V to 0.3V.

In this case, the resistance value of the sample $31_1$ was increased from 200Ω to 220Ω. When the resistance value of the sample $31_1$ was increased, the switch $33_1$ connected to the sample $31_1$ was turned off by the controller 7.

Thereby, when the switch $33_1$ connected to the sample $31_1$ in series was turned off, the current, which flowed through the ammeter 5, became 156.8 mA.

In this event, the elapsed time from the test start time to this time point was defined as the lifetime of the sample $31_1$.

When the above test was continued, the reduction of the current value was detected after 128 hr (time) from the test starting time.

Therefore, when the voltages of the both ends of the respective resistors $32_1$~$32_{50}$ were measured except the resistor $32_1$, the voltage of the resistor $32_4$ connected to the sample $31_4$ was reduced from 0.32V to 0.3V. Consequently, the resistance value of the sample $31_4$ was increased.

Thereby, the switch $33_4$ connected to the sample $31_4$ was turned off. The current of 153.6 mA flowed through the ammeter 5. In this event, the elapsed time until this time point was defined as the lifetime of the sample $31_4$.

Figure 7:
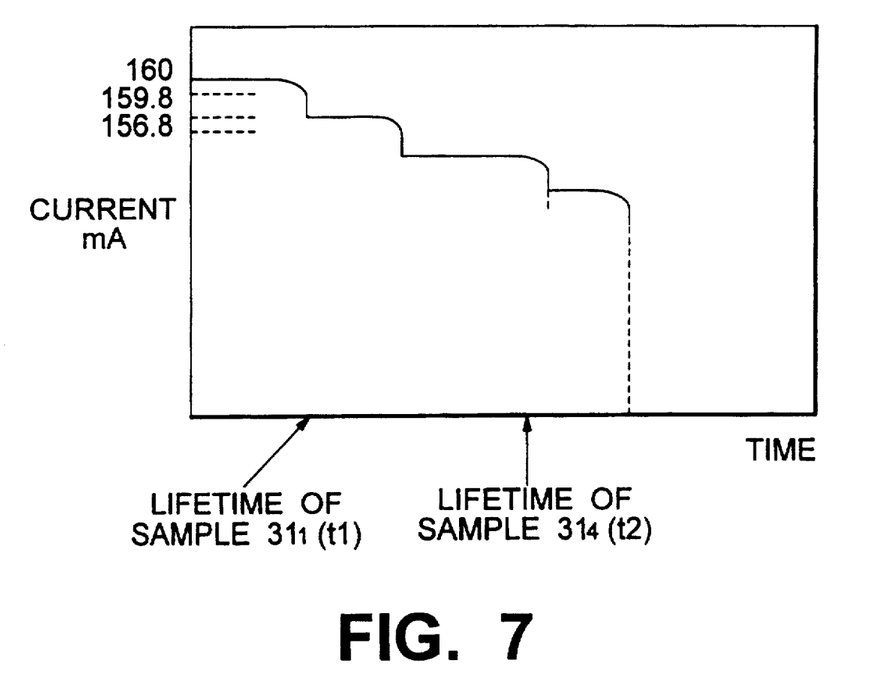
FIG. 7 is a graph showing a relation between elapsed time and current in a test system for testing a semiconductor device according to an example of this invention.

The lifetime of each sample $31_1$~$31_{50}$ was determined by repeating the above test operation, as illustrated in FIG. 7. In this event, the lifetime of each sample $31_1$~$31_{50}$ was plotted on the logarithmico-normal probability paper, and thereby, t50 and t0.1 could be determined, respectively.

What is claimed is:

1. A test system for testing a semiconductor device, comprising:

a plurality of semiconductor devices which are connected in parallel and which are to be tested;

resistors which are connected to the respective semiconductor devices in series;

switches which are connected to the respective resistors in series;

a voltage source which supplies a constant voltage for the respective semiconductor devices;

an ammeter which measures current that flows through the respective semiconductor devices from the voltage source;

a voltmeter which measures the respective voltage drops of the resistors; and a controller which is connected to the switches, the voltage source and the ammeter and which detects the specific resistor that is changed in a resistance value when the current measured by the ammeter is reduced and which turns off the switch connected to the specific resistor, wherein the resistance value is changed by electromigration, elapsed time until the detection of the specific resistor from the test starting time is defined as lifetime of the semiconductor device connected to the specific resistor, and the current value for the elapsed time is changed in a step-wise manner.

2. A system as claimed in claim 1, wherein:

the controller stores first voltage drops of the respective resistors at test starting time, stores second voltage drops of the respective resistors when the current is reduced, and detects the specific resistor by comparing the first voltage drops with the second voltage drops.

3. A system as claimed in claim 1, wherein:

the controller continues to test the remaining semiconductor devices except the semiconductor device connected to the specific resistor after the detection of the specific resistor.

4. A system as claimed in claim 1, wherein:

the resistor comprises a variable resistor.

5. A system as claimed in claim 4, wherein:

the variable resistor serves to correct manufacturing variation of internal resistance with respect to each semiconductor device.

6. A system as claimed in claim 1, wherein;

the semiconductor devices and the resistor are integrated in an integrated circuit.

7. A test system for testing a semiconductor device comprising:

a plurality of semiconductor devices which are connected in parallel and which are to be tested;

resistors which are connected to the respective semiconductor devices in series;

switches which are connected to the respective resistors in series;

a voltage source which supplies a constant voltage for the respective semiconductor devices;

an ammeter which measures current that flows through the respective semiconductor devices from the voltage source;

a voltmeter which measures the respective voltage drops of the resistors; and a controller which is connected to the switches, the voltage source and the ammeter and which detects the specific resistor that is changed in a resistance value when the current measured by the ammeter is reduced and which turns off the switch connected to the specific resistor, wherein the semiconductor devices and the resistors are integrated in an integrated circuit, the integrated circuit has a first electrode pad, a second electrode pad, a third electrode pad, and a fourth electrode pad, the semiconductor devices and the resistors are connected between the first electrode pad and the second electrode pad, the first electrode pad is coupled to the ammeter, the second electrode pad is coupled to the switch and, the third electrode pad and the fourth electrode pad are coupled to the voltmeter.

8. A system as claimed in claim 1, wherein:

the test comprises a test with respect to electromigration.

* * * * *